US 8,860,056 B2

(12) United States Patent
Tseng et al.

(10) Patent No.: US 8,860,056 B2
(45) Date of Patent: Oct. 14, 2014

(54) STRUCTURE AND METHOD FOR LED WITH PHOSPHOR COATING

(75) Inventors: Chi Xiang Tseng, Kaoshiung (TW);
Hsiao-Wen Lee, Hsinchu (TW);
Tien-Ming Lin, Hsinchu (TW);
Min-Sheng Wu, Guanyin Township, Taoyuan County (TW)

(73) Assignee: TSMC Solid State Lighting Ltd., Hsinchu (TW)

( * ) Notice: Subject to any disclaimer, the term of this patent is extended or adjusted under 35 U.S.C. 154(b) by 237 days.

(21) Appl. No.: 13/308,715

(22) Filed: Dec. 1, 2011

(65) Prior Publication Data
US 2013/0140591 A1 Jun. 6, 2013

(51) Int. Cl.
*H01L 33/00* (2010.01)

(52) U.S. Cl.
USPC ..................... 257/98; 257/E33.059

(58) Field of Classification Search
USPC ................... 257/E33.059, E33.061
See application file for complete search history.

(56) References Cited

U.S. PATENT DOCUMENTS

| | | | |
|---|---|---|---|
| 6,580,097 B1 * | 6/2003 | Soules et al. ................. | 257/100 |
| 7,235,817 B2 * | 6/2007 | Yano et al. .................... | 257/98 |
| 7,777,243 B2 * | 8/2010 | Lin et al. ...................... | 257/98 |
| 2004/0000868 A1 * | 1/2004 | Shimizu et al. ............... | 313/512 |
| 2005/0093422 A1 * | 5/2005 | Wang et al. ................... | 313/487 |
| 2008/0041488 A1 | 2/2008 | Savard et al. | |
| 2008/0203414 A1 * | 8/2008 | Yen et al. ....................... | 257/98 |
| 2008/0210961 A1 * | 9/2008 | Lin et al. ........................ | 257/98 |
| 2009/0010644 A1 | 1/2009 | Varshneya et al. | |
| 2010/0078664 A1 | 4/2010 | Hebling | |
| 2010/0237775 A1 * | 9/2010 | Chao ............................ | 313/506 |
| 2010/0315320 A1 * | 12/2010 | Yoshida ......................... | 345/83 |
| 2011/0057205 A1 * | 3/2011 | Mueller et al. ................ | 257/84 |
| 2011/0215353 A1 * | 9/2011 | Won et al. ...................... | 257/98 |

OTHER PUBLICATIONS

Unpublished Patent U.S. Appl. No. 13/150,449, filed Jun. 1, 2011 entitled, "LED Phosphor Patterning". 30 pages.
Kewei Chen, Rong Zhang and W.W. Ricky Lee, "Integration of Phosphor Printing and Encapsulant Dispensing Processes for Wafer Level LED Array Packaging," 2010 11th International Conference on Electronic Packaging Technology & High Density Packaging, 2010 IEEE, pp. 1386-1392.

* cited by examiner

Primary Examiner — Lex Malsawma
(74) Attorney, Agent, or Firm — Haynes and Boone, LLP

(57) ABSTRACT

The present disclosure provides a light emitting diode (LED) apparatus. The LED apparatus includes an LED emitter having a top surface; and a phosphor feature disposed on the LED emitter. The phosphor feature includes a first phosphor film disposed on the top surface of the LED emitter and having a first dimension defined in a direction parallel to the top surface of the LED emitter; a second phosphor film disposed on the first phosphor film and having a second dimension defined in the direction; and the second dimension is substantially less than the first dimension.

22 Claims, 9 Drawing Sheets

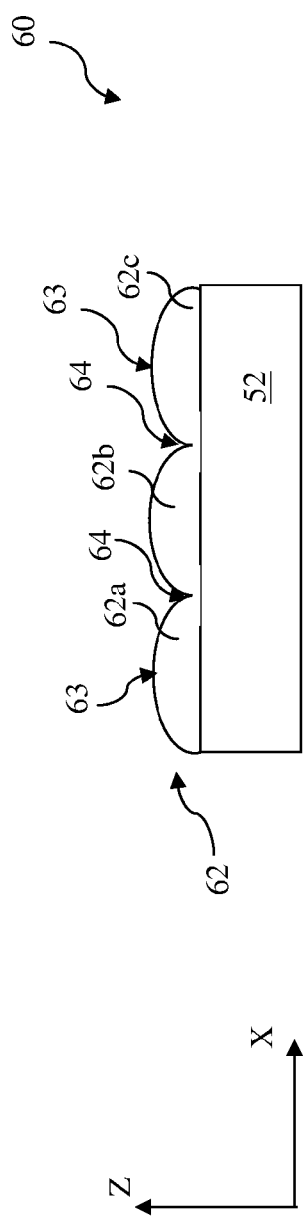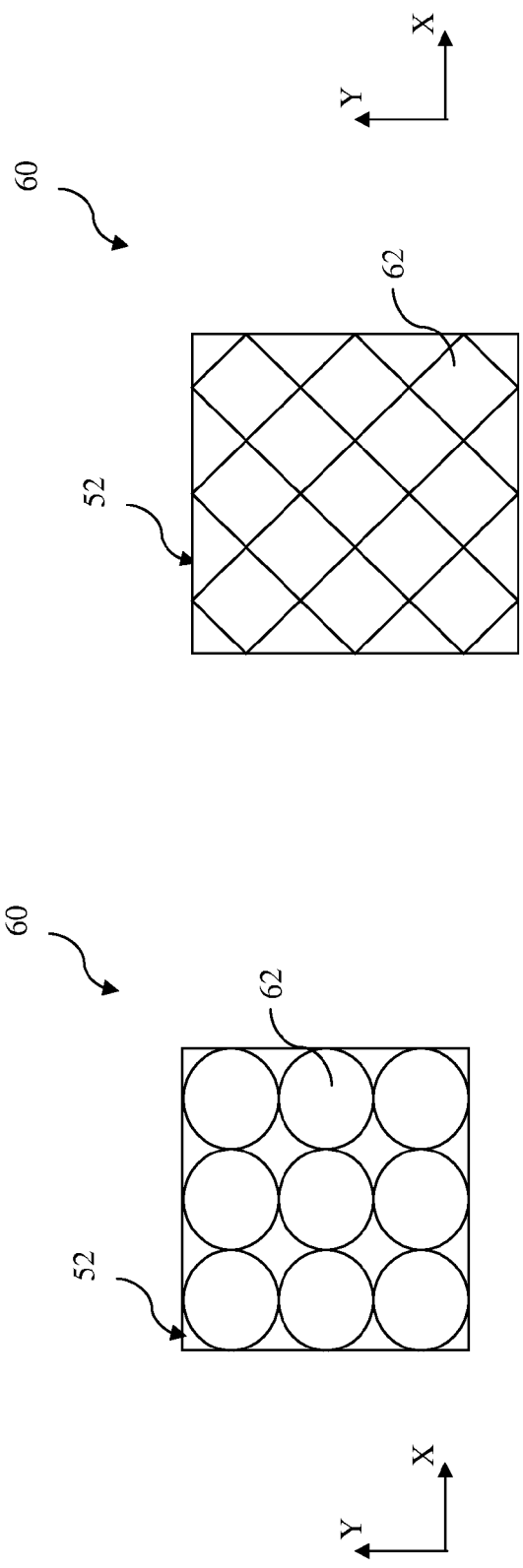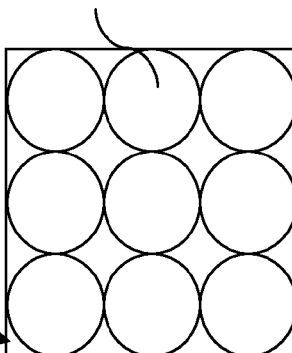

STRUCTURE AND METHOD FOR LED WITH PHOSPHOR COATING

CROSS-REFERENCE

The present disclosure is related to the following commonly-assigned U.S. patent application, the entire disclosure of which is incorporated herein by reference: U.S. Ser. No. 13/150,449 filed Jun. 1, 2011 by inventors Fu-Wen Liu et al for "LED PHOSPHOR PATTERNING".

BACKGROUND

A light emitting diode (LED) is a semiconductor material impregnated, or doped, with impurities. These impurities add "electrons" and "holes" to the semiconductor, which can move in the material relatively freely. Depending on the kind of impurity, dopants in a doped region of the semiconductor can have predominantly electrons or holes, and is referred to either as an n-type or p-type semiconductor region, respectively. In LED applications, the semiconductor includes an n-type semiconductor region and a p-type semiconductor region. A reverse electric field is created at the junction between the two regions, which cause the electrons and holes to move away from the junction to form an active region. When a forward voltage sufficient to overcome the reverse electric field is applied across the p-n junction, electrons and holes are forced into the active region and combine. When electrons combine with holes, they fall to lower energy levels and release energy in the form of light.

During operation, a forward voltage is applied across the p-n junction through a pair of electrodes. The electrodes are formed on the semiconductor material with a p-electrode formed on the p-type semiconductor region and an n-electrode formed on the n-type semiconductor region.

LED lighting typically uses phosphor materials to generate different color(s) from the LED and enhance color rendering index (CRI). An LED emits light with angle dependent intensity distribution. When a phosphor material is applied to an LED, it converts a portion of the light into a different color that is mixed with the unconverted portion. Depending on the angle, more or less light is converted, resulting in different colors after mixing. As perceived, the color, color temperature, and intensity of resulting light have an angle distribution. Additionally, due to multiple reflection at various interfaces, the light extraction efficiency is reduced.

Accordingly, what is needed is structure of an LED devices with phosphor coating and a method of making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 is a sectional view of an LED apparatus with a phosphor coating in accordance with one embodiment of the present disclosure.

FIG. 3A is a top view of the LED apparatus of FIG. 2 in accordance with one embodiment of the present disclosure.

FIG. 3B is a top view of the LED apparatus of FIG. 2 in accordance with another embodiment of the present disclosure.

DETAILED DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Figure 1:
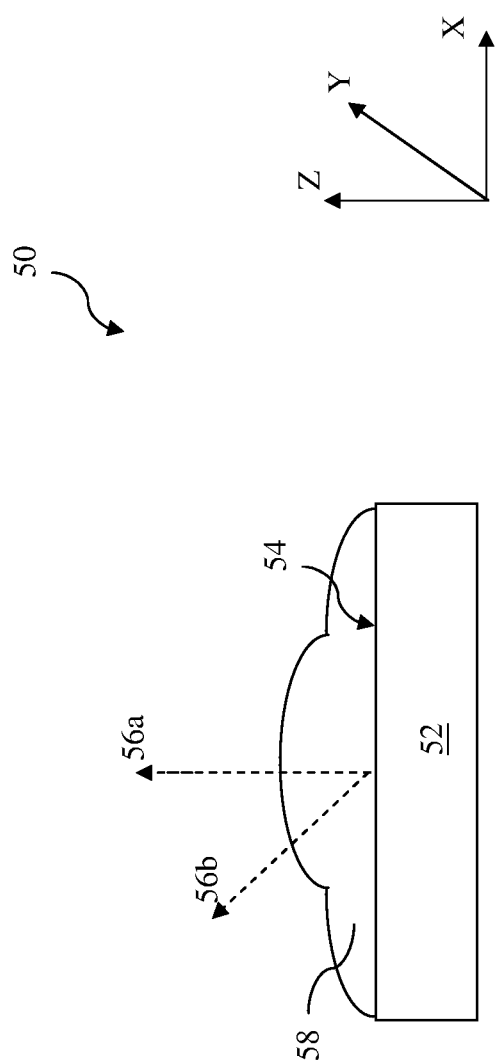
FIG. 1 illustrates an LED apparatus with a phosphor coating in accordance with various embodiments of the present disclosure.

FIG. 1 illustrates a light emitting apparatus (or light emitting device) 50 with a phosphor coating in accordance with various embodiments of the present disclosure. With reference to FIG. 1, the light emitting apparatus 50 and the method of making the same are collectively described.

The light emitting apparatus 50 includes a light-emitting device 52, such as a light emitting diode (LED or LED emitter). Accordingly, the light emitting apparatus 50 is also referred to as LED apparatus. The light emitting apparatus 50 The LED includes a semiconductor p-n junction that can emit spontaneous radiation in ultraviolet, visual, or infrared regions of the electromagnetic spectrum. In one embodiment, the LED emits blue light, such as a blue light having an emission peak ranging from about 430 nm to about 490 nm. The LED is formed on a substrate, such as a sapphire, silicon carbide, gallium nitride (GaN), or silicon substrate.

In one embodiment, the LED includes an n-type impurity doped cladding layer and a p-type doped cladding layer formed on the n-type doped cladding layer. In one example, the n-type cladding layer includes n-type gallium nitride (n-GaN), and the p-type cladding layer includes p-type gallium nitride (p-GaN). Alternatively, the cladding layers may include GaAsP, GaPN, AlInGaAs, GaAsPN, or AlGaAs doped with respective types. The LED may further include an indium gallium nitride/gallium nitride (InGaN/GaN) multi-quantum well layer disposed between the n-GaN cladding layer and the p-GaN cladding layer. The LED may further include a buffer layer, such as a GaN buffer layer, formed between the substrate and the n-GaN cladding layer. The LED may further include an InGaN/GaN layer formed on the p-GaN cladding layer. A transparent conductive layer, such as indium tin oxide (ITO), may be formed on the p-GaN cladding layer, coupled to a p-electrode. An n-electrode is formed on and coupled with the n-GaN cladding layer.

The light emitting device 52 includes a top surface 54 defined by two perpendicular axes (or directions): X axis and Y axis. A third direction perpendicular to the top surface or perpendicular to both X and Y axes is referred to as Z axis (or Z direction). When a proper electrical bias is applied to the two electrodes of the light emitting device 52, the light emitting device 52 will emit light. In one example, the light emitting device 52 emits a light beam 56a toward a forward direction (Z direction) perpendicular to the top surface 54, referred to as CCD(0°). In another example, the light emitting device 52 emits a light beam 56b toward a direction having an angle with the forward direction of about 45°, referred to as CCD(45°).

The LED is provided for only illustration and may vary in various applications. Further, the light emitting device 52 is not limited to the LED. Other types of light emitting devices may be additionally or alternatively formed or used. The light emitting device 52 may include other features such as a drive circuit integrated in an integrated circuit chip.

The light emitting apparatus 50 further includes a phosphor feature 58 attached on the light emitting device 52. The phosphor feature 58 includes a luminescent material (or phosphor or phosphor material) that emits light under light excitation. The phosphor is used to change the spectrum of the emitted light for proper illumination effect, such as white illumination. Particularly, the phosphor material is excited by the light of the light emitting device 52 and emits a light of a wavelength greater than that of the light from the light emitting device 52. In one embodiment, the phosphor material emits visual light, such as yellow light and/or red light upon blue or ultraviolet (UV) excitation. In one embodiment, the phosphor material includes a nitridosilicate phosphor doped by a rare earth element. In another embodiment, the phosphor material includes two or more types of phosphors each being designed to emit light with a respective spectrum (or peak wavelength).

Accordingly, the light emitted from the light emitting apparatus 50 includes a first portion directly from the light emitting device 52 and a second portion emitted from the phosphor material(s) in the phosphor feature 58.

Phosphor material itself is usually in powder and needs a carrying material when being applied to the light emitting device 52. In one embodiment, the phosphor feature 58 is a composite material having a phosphor powder dispersed in a carrying material that is transparent to the light from the light emitting apparatus 50. Particularly, the phosphor feature 58 includes a phosphor gel. The phosphor gel includes a gel or gel-like material with phosphor powder dispersed in. In one example, the phosphor gel includes silicone or epoxy with phosphor powder dispersed in. After the phosphor gel is applied to the light emitting device, it may be cured to a solid state at a high temperature.

In one embodiment, the phosphor feature 58 is disposed on the light emitting device 52 using a suitable technique, such as spraying. Other suitable technique may be utilized to form the phosphor feature 58 on the light emitting device 52 with a desired pattern (or a surface profile). In one embodiment, a mask having a plurality of openings is used for forming the phosphor feature 58. The phosphor gel may be sprayed to the light emitting device 52 through the openings of the mask The mask includes a mask substrate of a material, such as metal, quartz or ceramic material, with the openings formed in the mask substrate. The corresponding mask and the method to form the phosphor feature 58 are further described later.

The phosphor feature 58 is disposed and patterned to have a non-uniform structure and/or a non-flat surface profile such that the emitted light from the light emitting apparatus 50 has a less dependence over the emitting angle, enhancing the emitting light quality and reducing the relative change of the correlated color temperature (CCT) of the emitted light from the light emitting apparatus 50. The relative change of the CCD is defined as the difference between the CCD at different emitting angle, such as a difference between the CCD at the forward direction CCD(0°) and the CCD at the direction perpendicular to the forward direction CCD(90°).

FIG. 2 illustrates a sectional view of one embodiment of a light emitting apparatus 60 having a light emitting device 52 and a phosphor feature 62 disposed on the light emitting device 52. The phosphor feature 62 is patterned to have a plurality of sub-features, such as 62a, 62b and 62c illustrated in FIG. 2. The sub-features of the phosphor feature 62 are configured in an array. In one example, the sub-features of the phosphor feature 62 are configured in a periodic array.

FIG. 3A illustrates a top view of the light emitting apparatus 60 constructed according to aspects of the present disclosure in one embodiment. The sub-features of the phosphor feature 62 are in disk shape in the top view. Alternatively, the sub-features of the phosphor feature 62 may be shaped as squares, polygons, or other geometries, in the top view. Gaps may be formed between the sub-features of the phosphor feature 62, such as those shown in FIG. 3A.

FIG. 3B illustrates a top view of the light emitting apparatus 60 constructed according to aspects of the present disclosure in another embodiment. The phosphor feature 62 are patterned to a plurality of sub-features with square shape.

Still referring to FIG. 2, the phosphor feature 62 has an uneven surface profile that includes a plurality of peak points 63 and a plurality of dip points 64 interdigitated with each other. The dip points 64 are substantially below the peak points 63 in a sectional view. The surface of the phosphor feature between neighbor peak point and dip point is curved. In the present embodiment, each sub-feature of the phosphor feature 62 is defined between two neighbor dip points 64.

In the depicted embodiment, the sub-features of the phosphor feature 62 are substantially same in shape and size, and are further configured in a periodic array. Particularly, the dip points 64 are periodically configured along a horizontal direction, such as X axis, as illustrated in FIG. 2. Similarly, the peak points 63 are periodically configured along the same horizontal direction as well.

The light emitting apparatus 60 includes a phosphor feature 62 with an uneven surface profile and presents certain advantages in various embodiments. In one example, the surface profile of the light emitting apparatus 60 reduces the reflection of the emitted light at the surface of the phosphor feature 62. When the light reflection is strong, the angle distribution of the emitted light is more frequency (or wavelength) dependent. The correlated color temperature (CCT) is accordingly angle dependent. The relative change of the CCD is higher. By reducing the reflection of the emitted light by the disclosed phosphor feature 62, the relative change of the CCD is reduced and the light quality is improved for various applications, such as illumination.

Figure 4B:
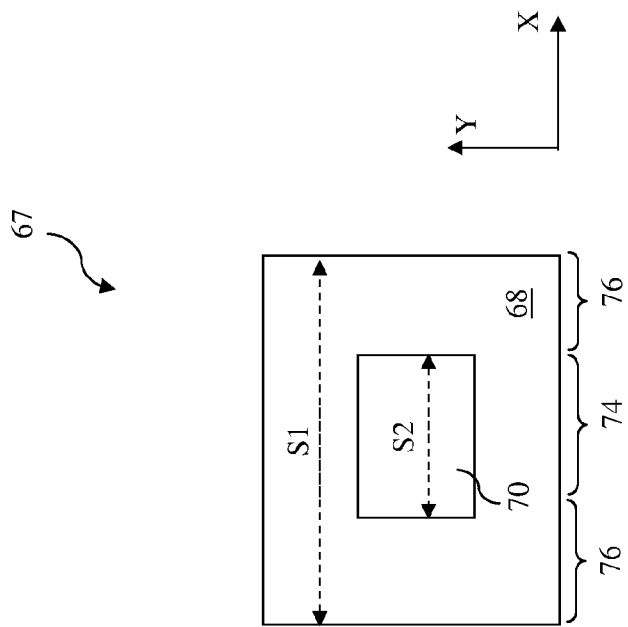
FIG. 4B is a top view of the LED apparatus of FIG. 4A in accordance with one embodiment of the present disclosure.
Figure 4A:
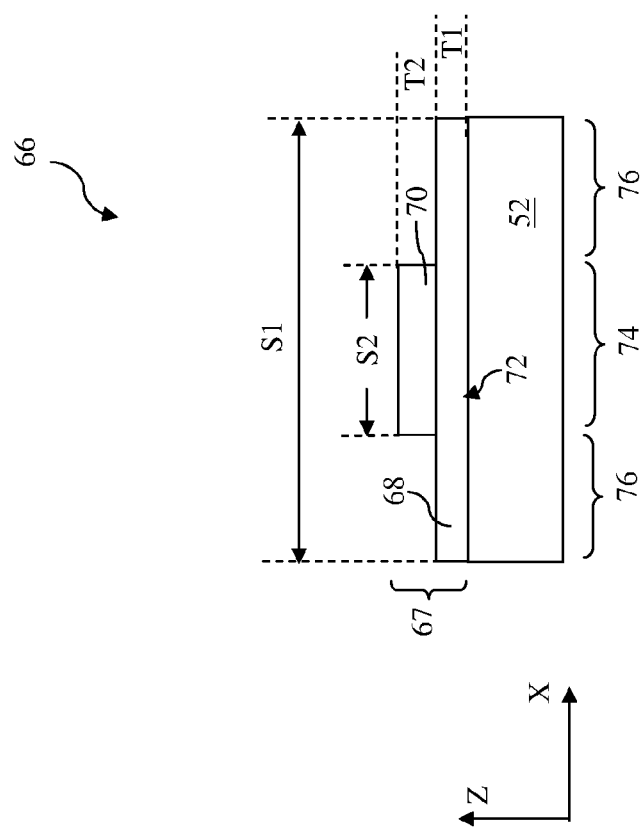
FIG. 4A is a sectional view of an LED apparatus with a phosphor coating in accordance with various embodiments of the present disclosure.

FIG. 4A illustrates a sectional view of a light emitting apparatus 66 constructed according to aspects of the present embodiment in another embodiment. FIG. 4B illustrates a top view of a phosphor feature 67 in the light emitting apparatus 66 constructed according to aspects of the present embodiment.

Referring to FIGS. 4A and 4B, the light emitting apparatus 66 includes a light emitting device 52 and further a phosphor feature 67 disposed on the light emitting device 52. The phosphor feature 67 further includes a first phosphor film 68 disposed on the light emitting device 52 and a second phosphor film 70 disposed on the first phosphor film.

The first phosphor film 68 includes a first phosphor material and the second phosphor film 70 includes a second phosphor material. In one embodiment, the first and second phosphor materials are a same phosphor material, such as a phosphor designed to emit red light under excitation of blue or UV light.

In another embodiment, the first and second phosphor materials are different phosphor materials designed to emit respective lights. For example, the first phosphor material emits a first light having a first peak wavelength. The second phosphor material emits a second light having a second peak wavelength. The second peak wavelength is substantially greater than the first peak wavelength. In another example, the first phosphor material emits yellow light under excitation and the second phosphor material emits red light under the excitation.

Still referring to FIGS. 4A and 4B, the light emitting device 52 has a top surface 72 defined by two perpendicular axes X and Y. A third axis Z is perpendicular to the top surface or the both X and Y axis. The top surface 72 of the light emitting device 52 includes a first region (or central region) 74 and a second region (or surrounding region) 76 surrounding the first region 74. The first phosphor film 68 is disposed on the top surface of the light emitting device 52 in both the first region 74 and the second region 76. The second phosphor film 70 is disposed on the first phosphor film 68 only with the first region 74.

In a sectional view as illustrated in FIG. 4A, the first phosphor film 68 has a first thickness T1 and the second phosphor film 70 has a second thickness T2. the phosphor feature 67 has an uneven surface profile that has a central thickness in the first region 74 and an edge thickness in the second region 76. The central thickness is substantially greater than the edge thickness. Particularly, the central thickness of the phosphor feature 67 equals to the sum of the first thickness T1 and the second thickness T2. The edge thickness of the phosphor feature 67 equals to the first thickness T1.

Furthermore, the first phosphor film 68 spans in a horizontal direction, such as the X axis, with a first dimension "S1". The second phosphor film 70 spans in the same direction with a second dimension "S2". The second dimension S2 is substantially less than the first dimension S1.

In the present embodiment, the first and second phosphor films 68 and 70 are designed in square shapes, in the top view as illustrated in FIG. 4B. Alternatively, the first and second phosphor films 68 and 70 may be designed to other proper shape, such as disks or rectangles.

The first and second phosphor films 68 and 70 can be formed by spray by a procedure including a first step to form the first phosphor film 68 and a second step to form the second phosphor film 70. Each step may use a mask with respective openings such that the phosphor material can be disposed through the openings of the mask.

The light emitting apparatus 66 includes a phosphor feature 67 having a first phosphor film and a second phosphor film on the first phosphor film, as described above. The phosphor feature 67 with the disclosed structure presents certain advantages in various embodiments.

As one example for illustration, in the LED emission, the light of higher frequency and shorter wavelength (e.g., blue) is more directional and the corresponding light intensity is more distributed in a smaller range around the forward direction. Comparably, the light of lower frequency and longer wavelength (e.g., red from the phosphor material) is more non-directional and the corresponding light intensity is more distributed in a broader range around the forward direction. Thus, the light from a light emitting apparatus looks more blue in the forward direction and more red in other directions away form the forward direction. The CCT is changing over the angle, referred to as CCT angle effect. The disclosed phosphor feature 67 reduces the relative change of the CCT and renders the uniform color of the light emitting apparatus.

In one embodiment, both the first and second phosphor films are a same type phosphor material, such as a phosphor material to emit red light. As the second phosphor film is only disposed on a central region, the phosphor feature 67 is thicker in the central region and thin in an edge region surrounding the central region. Accordingly, the forward light (e.g., blue light) from the light emitting device 52 experiences more excitation and emission. The corresponding red light from the phosphor feature 67 in the forward direction is enhanced in intensity. The corresponding red light from the phosphor feature 67 in other direction is reduced in intensity. Thus, the CCT angle effect is substantially compensated. Collectively, the light from the light emitting apparatus 66 (including the light emitting device 52 and the phosphor feature 67) is more uniform with improved illumination quality.

In another embodiment, the first phosphor film includes a first phosphor material and the second phosphor film includes a second phosphor material. For example, the first phosphor material emits yellow light, and so also referred to as yellow phosphor. The second phosphor material emits red light, and so also referred to as red phosphor. As the second phosphor film is only disposed on a central region, the phosphor feature 67 emits red light only in the central region (corresponding to a narrow angle) and emits yellow light in both the central and edge regions (corresponding to a broad angle). Accordingly, the forward light (e.g., blue light) from the light emitting device 52 experiences more excitation and emission. Accordingly, the light from the phosphor feature 67 is more red in the forward direction and more yellow in other directions. Thus, the CCT angle effect is substantially compensated. Collectively, the light from the light emitting apparatus 66 (including the light emitting device 52 and the phosphor feature 67) is more uniform with improved illumination quality.

Figure 5:
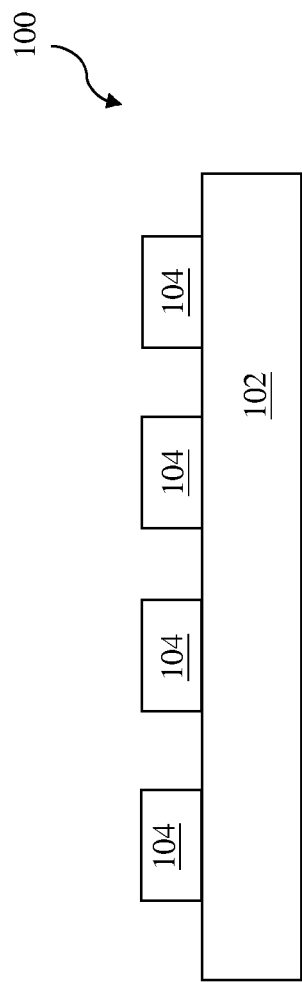
FIGS. 5 through 7 are sectional views of an LED apparatus with a phosphor coating at various fabrication stages in accordance with various embodiments of the present disclosure.
Figure 6:
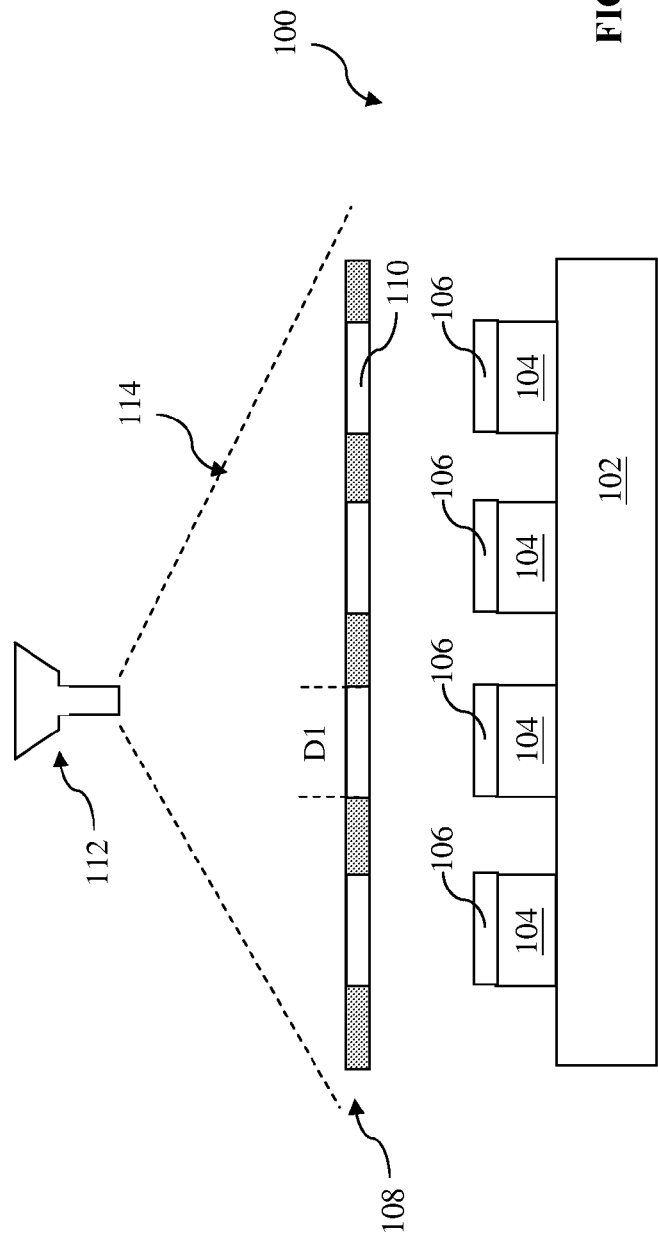
Figure 7:
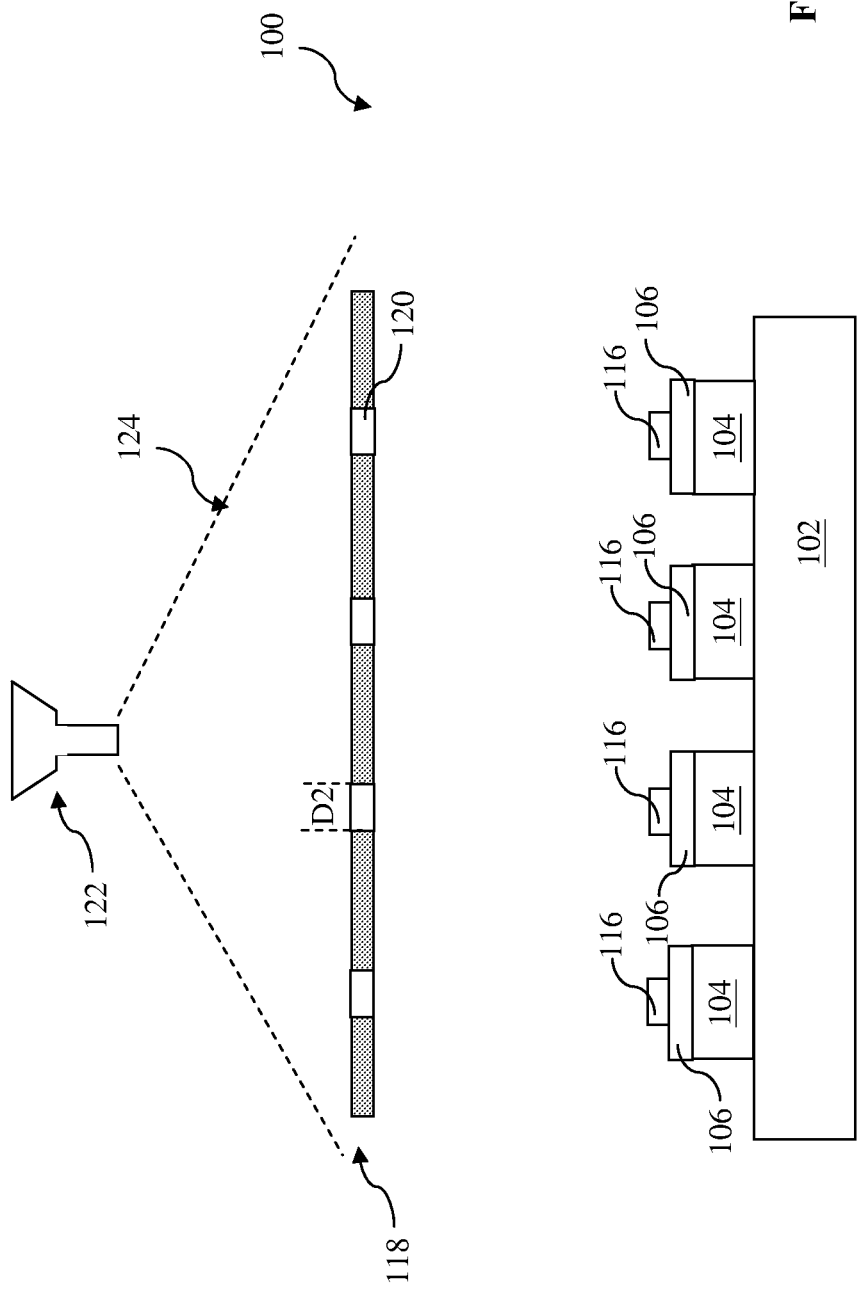
Figure 8:
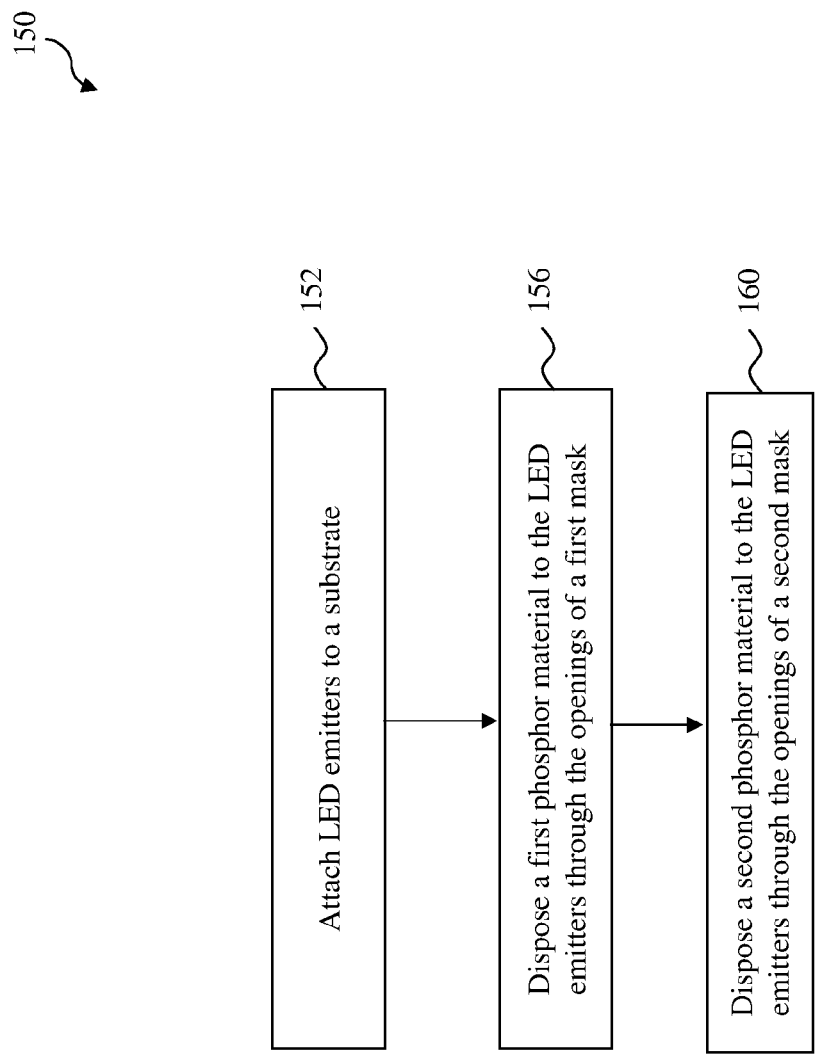
FIG. 8 is a flowchart illustrating a method of fabricating an LED apparatus in accordance with various aspects of the present disclosure.

FIGS. 5 through 7 illustrate sectional views of a semiconductor structure 100 at various fabrication stages constructed according to aspects of the present disclosure in on or more embodiments. The semiconductor structure 100 includes a plurality of light emitting apparatus, such as the light emitting apparatus 66 in FIG. 4A. FIG. 8 is a flowchart of a method 150 making the semiconductor structure 100 in one embodiment. With references to FIGS. 5 though 8, the semiconductor structure 100 and the method 150 are collectively described.

Referring to FIGS. 5 and 8, the method 150 begins at step 152 by attaching to a substrate 102 with a plurality of light emitting devices 104. One example of the light emitting devices 104 is the light emitting device 52. In the present embodiment, the light emitting devices 104 are LED chips (or LED emitters). In another embodiment, the substrate 102 includes a semiconductor substrate, such as a silicon wafer. Alternatively, the substrate 102 may include other suitable substrate, such as a metal substrate, a quartz substrate, or a ceramic substrate. In another embodiment, the LED chips are bonded to the substrate 102 with a suitable bonding mechanism, such as eutectic bonding or diffusion bonding. In the present embodiment, various fabrication steps are implemented in a wafer level, resulting in a plurality of LED apparatuses.

In another embodiment, the substrate 102 further includes metal trace designed and configured for proper bonding effect. In yet another embodiment, the substrate 102 may further include other features, such as through silicon via (TSV), for electrical wiring. In another embodiment, the substrate may further include various doped regions and other features configured to provide an integrated circuit, such as a driving circuit, to the LED emitters 104.

Referring to FIGS. 6 and 8, the method 150 proceeds to step 156 by dispensing a first phosphor material to the LED emitters 104, forming a first phosphor film 106 on the LED emitters 104. In the present embodiment, the first phosphor film 106 is formed by spray using a first mask 108.

The first mask 108 includes a suitable mask substrate, such as a metal substrate, a ceramic substrate, or a quartz substrate. The first mask 108 also includes various openings (or apertures) 110 formed in the mask substrate. The mask 108 are positioned over the substrate 102 such that the apertures 110 of the mask 108 are aligned with respective LED emitters 104. The dimensions of mask 108 (aperture widths, aperture locations, and the like) are designed and tuned to define the first phosphor film 106 and the geometry and/or shape of the first phosphor film. In one example, the mask 108 is positioned a distance above the substrate 102 without direct contact with the LED emitters 104.

The plurality of openings 110 of the first mask 108 may be designed to have a proper shape and size such that the first phosphor film 106 substantially covers the top surface of the LED emitters 104. In one example, the LED emitters 104 are sawed to square chips. Accordingly, the openings 110 are designed to be square openings as well. Each of the openings 110 in the first mask 108 includes a dimension D1 as illustrated in FIG. 6. When the openings 110 are square openings, the dimension D1 is the width of the respective square opening. In the present embodiment, the LED emitters 104 are sized same. Accordingly, the openings 110 are designed to the same dimension D1.

The first phosphor material is applied to the LED emitters 104 through the openings 110 of the first mask 108 by spray. A spray mechanism, such as a spray module (or a spray head) 112, is provided for spray coating the LED emitters 104. The spray module 112 is coupled with a supply module to provide the first phosphor material for spray coating 114.

Furthermore, the dimension of the first phosphor film 106 is related to the dimension D1 of the openings 110 in the first mask 108. When the first mask 108 is positioned substantially close to the LED emitters 104 and the first phosphor material is applied to the LED emitters 104 through the openings by spray coating, the dimension of the first phosphor film 106 substantially equals to the dimension D1 of the openings 110 in the first mask 108. Advantageously, the first mask 108 is reusable for subsequent production, allowing for reduced costs. For example, after step 156, the first mask 108 may be cleaned for reuse.

In the present embodiment, the first phosphor material is a composite material having a phosphor powder dispersed in a carrying material, such as silicone or epoxy. In one example, the composite phosphor material is a gel-like material that is able to be sprayed to the coating surface. After the first phosphor material is applied to the LED emitters 104, a high temperature process may be further applied to cure the coated first phosphor material, forming the first phosphor film 106.

Alternatively, other suitable technique may be used to coat the LED emitters 104. In another embodiment, the first phosphor material is applied to the LED emitters 104 by screen print. The first mask 108 is used as a screen printing plate. Additionally, a squeegee blade or a roller may be used to move the first phosphor material to the LED emitters 104 through the openings 110.

Referring to FIGS. 7 and 8, the method 150 proceeds to step 160 by dispensing a second phosphor material to the LED emitters 104, forming a second phosphor film 116 on the first phosphor film 106. In the present embodiment, the second phosphor film 116 is formed by spray using a second mask 118.

The second mask 118 includes a suitable mask substrate, such as a metal substrate, a ceramic substrate, or a quartz substrate. The second mask 118 also includes various openings 120 formed in the mask substrate. The mask 118 are positioned over the substrate 102 such that the apertures 120 of the mask 118 are aligned with respective LED emitters 104. The dimensions of mask 118 (aperture widths, aperture locations, and the like) are designed and tuned to define the second phosphor film 116 and the geometry and/or shape of the second phosphor film 116. In one example, the mask 118 is positioned a distance above the substrate 102 without direct contact with the first phosphor film 106.

The plurality of openings 120 of the second mask 118 are designed to have a proper shape and size such that the second phosphor film 116 is disposed on the first phosphor film 106 and partially covers the first phosphor film 106.

In one example, the openings 120 are designed to be square openings. Each of the openings 120 in the second mask 118 includes a dimension D2 as illustrated in FIG. 7. When the openings 120 are square openings, the dimension D2 is the width of the respective square opening. In the present embodiment, the openings 120 are designed to the same dimension D2.

The openings 120 of the second mask 118 are designed differently from those of the first mask 108. Particularly, the dimension D2 of the openings 120 is less than the dimension D1 of the openings 110.

The second phosphor material is applied to the LED emitters 104 through the openings 120 of the second mask 118 by spray. A spray module 122, is provided for spray coating the LED emitters 104. The spray module 122 is coupled with a supply module to provide the second phosphor material for spray coating 124. Alternatively, other technology, such as screen print, may be used to form the second phosphor film 116.

Accordingly, thus formed second phosphor film 116 has a smaller dimension than that of the first phosphor film 106. In one example, the dimension of the second phosphor film 116 substantially equals to the dimension D2 of the openings 120 in the second mask 118.

Similarly, the second phosphor material is a composite material having a phosphor powder dispersed in a carrying material, such as silicone or epoxy. In one example, the composite phosphor material is a gel-like material that is able to be sprayed to the coating surface. After the second phosphor material is applied to the LED emitters 104, a high temperature process may be further applied to cure the coated second phosphor material, forming the second phosphor film 116 on the first phosphor film 106.

In another embodiment, the first and second phosphor materials are same. For example, both the first and second phosphor materials are designed to emit red light (or yellow light) under the excitation. In another embodiment, the first phosphor material is designed to emit yellow light under the excitation while the second phosphor material is designed to emit red light under the excitation.

Figure 9:
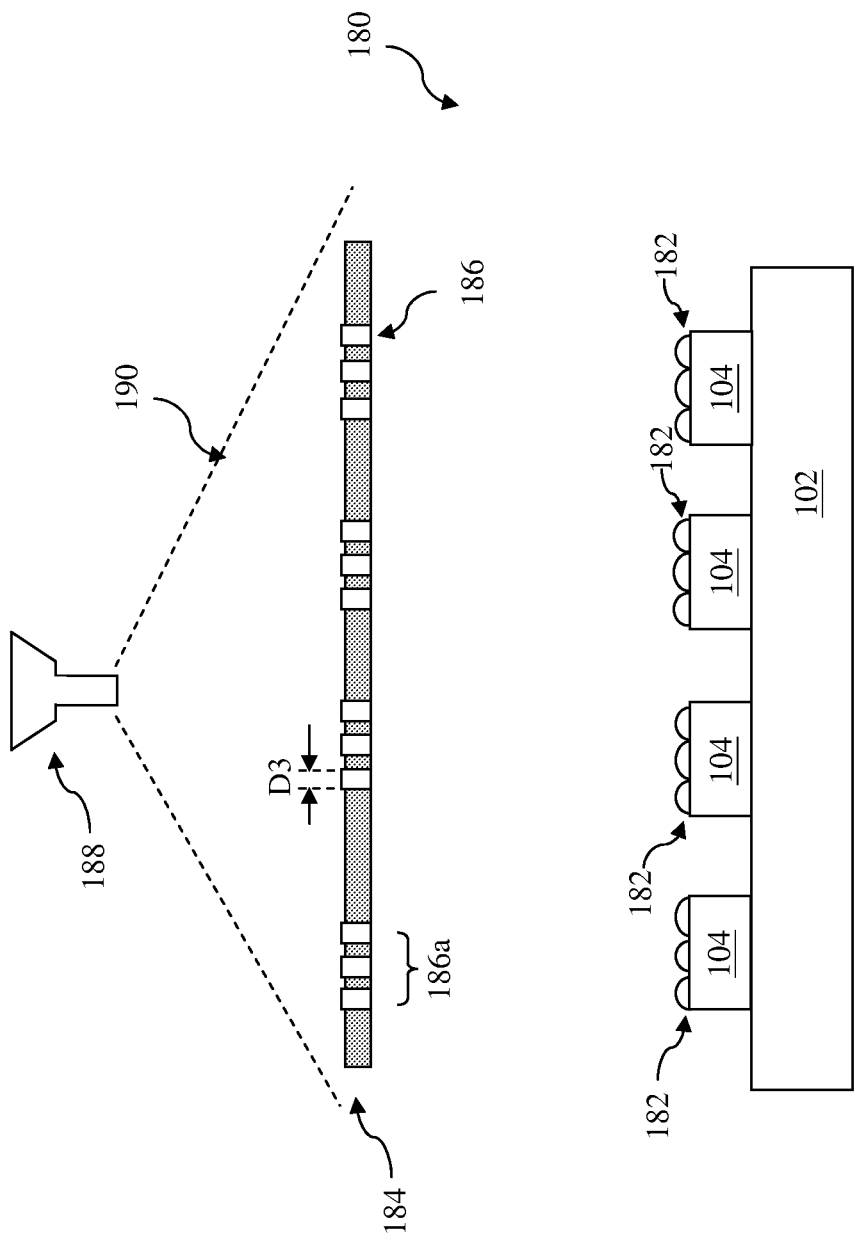
FIG. 9 is a sectional view of an LED apparatus with a phosphor coating at a fabrication stage in accordance with various embodiments of the present disclosure.

FIG. 9 illustrates a sectional view of a semiconductor structure 180 at a fabrication stage constructed according to aspects of the present disclosure in another embodiment. The semiconductor structure 180 includes a plurality of light emitting apparatus, such as the light emitting apparatus 60 in FIG. 2. With reference to FIG. 9, the semiconductor structure 180 and the corresponding method are collectively described.

A plurality of light emitting devices 104 are attached to a substrate 102 similar to the step 152 of the method 150. One example of the light emitting devices 104 is the light emitting device 52. In the present embodiment, the light emitting devices 104 are LED chips (or LED emitters). In another embodiment, the substrate 102 includes a semiconductor substrate, such as a silicon wafer. Alternatively, the substrate 102 may include other suitable substrate, such as a metal substrate, a quartz substrate, or a ceramic substrate. In another embodiment, the LED chips are bonded to the substrate 102 with a suitable bonding mechanism, such as eutectic bonding or diffusion bonding. In the present embodiment, various fabrication steps are implemented in a wafer level, resulting in a plurality of light emitting apparatuses.

A phosphor feature 182 is formed on the LED emitters 104 having a first phosphor material. The phosphor feature 182 is disposed and patterned to have a non-flat surface profile such that the emitted light has a less dependence over the emitting angle, enhancing the emitting light quality and reducing the relative change of the correlated color temperature (CCT) thereof.

In one embodiment, the phosphor material is a composite material having a phosphor dispersed in a carrying material, such as silicone or epoxy. The phosphor emits red or yellow light under excitation according to one example.

In the present embodiment, the phosphor feature 182 is formed by spray using a mask 184. The mask includes a mask substrate of a material, such as metal, quartz or ceramic material, with the openings 186 formed in the mask substrate. The mask 182 are positioned over the substrate 102 such that the apertures 186 of the mask 184 are aligned with respective LED emitters 104. Particularly. The openings 186 includes subsets of openings, such as a subset of openings 186a. Each subset of openings is aligned with one LED emitter.

The openings 186 are designed and tuned to define the phosphor features 182 and the geometry and/or shape thereof. The plurality of openings 186 of the mask 184 may be designed to have a proper shape, such as disk, square, or rectangle.

The phosphor material is applied to the LED emitters 104 through the openings 186 of the mask 184 by spray. A spray mechanism, such as a spray module (or a spray head) 188, is provided for spray coating the LED emitters 104. The spray module 188 is coupled with a supply module to provide the phosphor material for spray coating 190.

Furthermore, the geometry of the phosphor feature 182 is related to the design of the openings 186 in the mask 184. Each phosphor feature 182 includes a plurality of sub-features corresponding to the respective subset of the openings 186. In the depicted example, the each subset of openings 186 includes 3×3 openings. Accordingly, each phosphor feature 182 includes 3×3 sub-features.

Each of the openings 186 has a size (or width) D3 substantially smaller than the size of the LED emitter 104. The size D3 of the openings 186 is substantially smaller than the size D1 of the openings mask 110 in FIG. 6 as well.

When the mask 184 is positioned substantially close to the LED emitters 104 and the phosphor material is applied to the LED emitters 104 through the openings 186 by spray coating, the dimension of each sub-feature in the phosphor feature 182 substantially equals to the dimension D3 of the openings 186 in the mask 184.

After the phosphor material is applied to the LED emitters 104, a high temperature process may be further applied to cure the coated first phosphor material, forming the phosphor features 182. Alternatively, other suitable technique, such as screen printing, may be used to coat the LED emitters 104. Thus formed phosphor feature 182 is similar to the phosphor feature 62 having an uneven surface profile that includes a plurality of peak points and a plurality of dip points. The dip points are substantially below the peak point in a sectional view. In the present embodiment, each sub-feature of the phosphor feature 182 is defined between two neighbor dip points.

Figure 10:
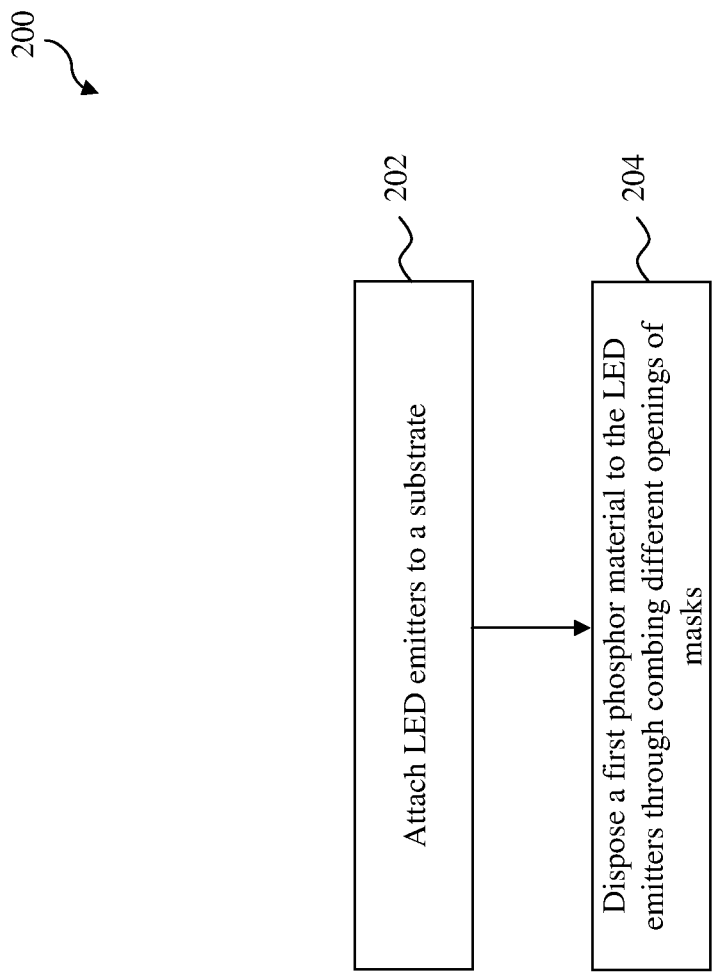
FIG. 10 is a flowchart illustrating a method of fabricating an LED apparatus in accordance with various aspects of the present disclosure in another embodiment.
Figure 11:
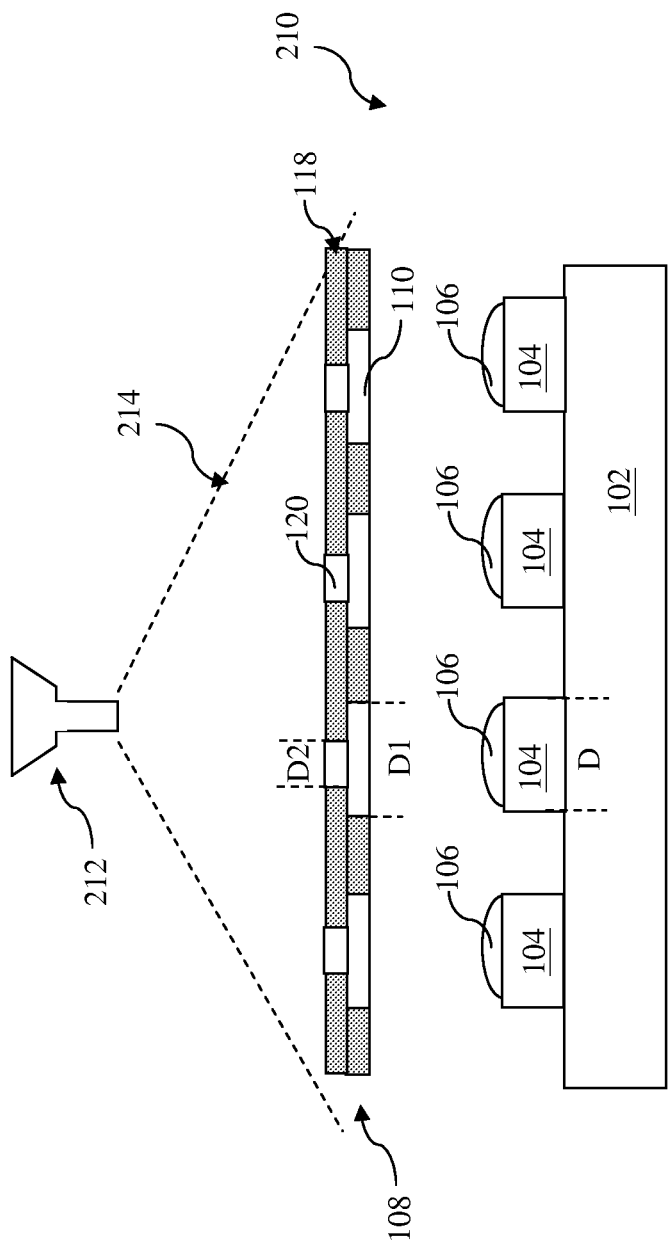
FIG. 11 is a sectional view of an LED apparatus with a phosphor coating at a fabrication stage in accordance with another embodiment of the present disclosure.

FIG. 10 is a flowchart of a method 200 making a semiconductor structure in one embodiment. FIG. 11 illustrates a sectional view of a semiconductor structure 210 at a fabrication stage constructed according to aspects of the present disclosure in one embodiment. The semiconductor structure 210 includes a plurality of light emitting apparatus, such as the light emitting apparatus 66 in FIG. 4A. Different from the method 150, the method 200 uses both the first mask 108 and the second mask 118 simultaneously. With references to FIGS. 10 and 11, the semiconductor structure 210 and the method 200 are collectively described.

The method 200 begins at step 202 by attaching to a substrate 102 with a plurality of light emitting devices 104. The step 202 is similar to the step 152 of FIG. 2. In one example, the light emitting devices 104 is the light emitting device 52. In the present embodiment, the light emitting devices 104 are LED chips (or LED emitters). In another embodiment, the substrate 102 includes a semiconductor substrate, such as a silicon wafer. Alternatively, the substrate 102 may include other suitable substrate, such as a metal substrate, a quartz substrate, or a ceramic substrate. In another embodiment, the LED chips are bonded to the substrate 102 with a suitable bonding mechanism, such as eutectic bonding or diffusion bonding. In the present embodiment, various fabrication steps are implemented in a wafer level, resulting in a plurality of LED apparatuses.

The method 200 proceeds to step 204 by dispensing a first phosphor material to the LED emitters 104, forming a first phosphor film 106 on the LED emitters 104. In the present embodiment, the first phosphor film 106 is formed by spray using a first mask 108 and a second mask 118 simultaneously. Particularly, the first mask 108 and the second mask 118 are stacked such that the first phosphor material is sprayed through the openings 110 of the first mask 108 and the openings 120 of the second mask 118.

The first mask 108 includes openings 110 formed in the respective mask substrate. Each of the openings 110 in the first mask 108 includes a first dimension D1. Similarly, the second mask 118 includes openings 120 formed in the respective mask substrate. Each of the openings 120 in the second mask 118 includes a second dimension D2. The second dimension is less than the first dimension D1. The second mask 118 is stacked on the first mask 108 such that their respective openings are aligned, respectively. In the present embodiment, the first mask 108 and the second mask 118 are configured such that central axis of the respective openings 120 are aligned with the central axis of the respective openings 110, respectively. The first mask 108 and the second mask 118 thus combined together to provide the combined openings or shaped openings (110 and 120) to confine the spray of the first phosphor material.

The combined masks 108 and 118 are positioned over the substrate 102 such that the openings 110 and 120 are aligned with respective LED emitters 104. Particularly, the central axis of the respective shaped openings (110 and 120) are aligned with the central axis of the respective LED emitters 104. The dimensions of combined masks 108 and 118 (opening widths, opening locations, and the like) are designed and tuned to define the first phosphor film 106 and the geometry and/or shape of the first phosphor film. The emitters 104 have a dimension D. In a particular embodiment, the second dimension D2 is less than D and the first dimension D1 is substantially equal to D.

The second openings 120 confine the sprayed first phosphor material to substantially land on central regions of the top surface of the LED emitters 104. The first openings 110 confine the angle-sprayed first phosphor material to substantially land on edge regions of the top surface of the LED emitters 104. Thus formed first phosphor film 106 has a curved profile. The thickness of the first phosphor film 106 in the central regions is greater than the thickness of the first phosphor film 106 in the edge regions.

The first phosphor material is applied to the LED emitters 104 through the combined openings by spray. A spray mechanism, such as a spray module (or a spray head) 212, is provided for spray coating the LED emitters 104. The spray module 212 is coupled with a supply module to provide the first phosphor material for spray coating 214.

In the present embodiment, the first phosphor material is a composite material having a phosphor powder dispersed in a carrying material, such as silicone or epoxy. After the first phosphor material is applied to the LED emitters 104, a high temperature process may be further applied to cure the coated first phosphor material, forming the first phosphor film 106.

Alternatively, a second phosphor material may be coated on the first phosphor film 106 by another spray step. In one embodiment, the first phosphor material is designed to emit yellow light under the excitation while the second phosphor material is designed to emit red light under the excitation.

Although various features and steps are described according to various aspects in one or more embodiments, other alternatives may present without departure from the scope of the present disclosure. For example, the semiconductor substrate 100 is further diced to form various LED apparatuses. Thus, the present disclosure provides a wafer level packaging with reduced manufacturing cost and an LED apparatus each having a phosphor feature that has a first phosphor film and a second phosphor film. The second phosphor film is patterned to have a smaller dimension than the first phosphor film. Thus, the disclosed method provides a wafer level packaging with reduced manufacturing cost and improved product quality.

The various aspects of this disclosure are provided to enable one of ordinary skill in the art to practice the present disclosure. Various modifications to aspects presented throughout this disclosure will be readily apparent to those skilled in the art, and the concepts disclosed herein may be extended to other applications. Thus, the claims are not intended to be limited to the various aspects of this disclosure, but are to be accorded the full scope consistent with the language of the claims. All structural and functional equivalents to the elements of the various aspects described throughout this disclosure that are known or later come to be known to those of ordinary skill in the art are expressly incorporated herein by reference and are intended to be encompassed by the claims.

In one embodiment, the phosphor feature may includes more than two phosphor films. For example, the phosphor feature includes three phosphor films of same or different phosphor materials. Three phosphor films have different sizes to compensate the CCD angle effect.

In another embodiment, the phosphor feature includes two or more phosphor films. At least one of the phosphor films is patterned to have a plurality sub-features to tune the surface profile and reduce the reflection and enhance the light extraction.

Thus, the present disclosure provides one embodiment of a light emitting diode (LED) apparatus. The LED apparatus includes an LED emitter having a top surface; and a phosphor feature disposed on the LED emitter. The phosphor feature includes a first phosphor film disposed on the top surface of the LED emitter and having a first dimension defined in a direction parallel to the top surface of the LED emitter; a second phosphor film disposed on the first phosphor film and having a second dimension defined in the direction; and the second dimension is substantially less than the first dimension.

In one example of the LED apparatus, the first phosphor film includes a first phosphor material; and the second phosphor film includes a second phosphor material different from the first phosphor material.

In furtherance of the example, the first phosphor material emits a first light having a first peak wavelength; and the second phosphor material emits a second light having a second peak wavelength that is substantially greater than the first peak wavelength. In a particular example, the LED emitter emits a blue light; the first phosphor material emits a yellow light upon being excited by the blue light from the LED emitter; and the second phosphor material emits a red light upon being excited by the blue light from the LED emitter.

In another example, the LED emitter includes a first region and a second region surrounding the first region on the top surface; the first phosphor film is disposed in both the first region and the second region; and the second phosphor film is disposed within the first region.

In another example, the first phosphor film and the second phosphor film include a same phosphor material.

In yet another example, the first phosphor film has a first thickness and the second phosphor film has a second thickness; and the phosphor feature has a third thickness in the first region and a fourth thickness in the second region. The third thickness is equal to the sum of the first thickness and the second thickness film; and the fourth thickness is equal to the first thickness.

In another example, at least one of the first and second phosphor films is patterned to have a plurality of sub-features configured in an array.

In another example, the plurality of sub-features each include a shape selected from the group consisting of a disk, a square, and a polygon, in a top view. In yet another example, the plurality of sub-features includes a plurality peak points and a plurality of dip points; and the peak points are inter-digitated with the dip points in the direction. In yet another example, the peak points and the dip points are configured periodically along the direction.

The present disclosure also provides another embodiment of a light emitting diode (LED) apparatus. The apparatus includes an LED emitter; and a first phosphor layer disposed on the LED emitter and patterned to have a plurality of sub-features in an array.

In one example, the plurality of sub-features each include one shape selected from the group consisting of a disk, a square, and a polygon, in a top view.

In another example, the first phosphor layer has a periodic surface profile that includes a plurality of peak points and a plurality of dip points, the dip points being substantially below the peak points in a sectional view.

In another example, the LED apparatus further includes a second phosphor layer disposed on the first phosphor layer. In furtherance of the example, the first phosphor layer spans to a first dimension in a first direction parallel with a top surface of the LED emitter; the second phosphor layer spans to a second dimension in the first direction; and the first dimension is substantially greater than the second dimension.

In another example, the first phosphor layer includes an encapsulation material containing one of silicone and epoxy; and a phosphor power dispersed in the encapsulation material.

The present disclosure also provides a method of making a light emitting diode (LED) apparatus. The method includes providing a plurality of LED emitters disposed on a substrate; providing a first mask over the plurality of LED emitters, wherein the first mask includes a plurality of first openings; and coating the plurality of LED emitters with phosphor through the first openings of the mask, resulting in each of the LED emitters with a first phosphor feature having a plurality of sub-features.

In one example, the coating the plurality of LED emitters with phosphor includes spraying a phosphor material to the plurality of LED emitters through the first openings of the first mask.

In another example, the coating the plurality of LED emitters with phosphor includes coating the plurality of LED emitters with a phosphor gel using the first mask as a screen printing plate, the phosphor gel including an encapsulation material dispersed with the phosphor.

In yet another example, the providing a first mask includes providing a first mask with the plurality of first openings that has a subset of openings designed to form the plurality of sub-features of the first phosphor feature to one of the LED emitters.

In yet another example, the method further includes providing a second mask over the plurality of LED emitters, wherein the second mask includes a plurality of second openings different from the first openings; and coating the plurality of LED emitters with phosphor through the second openings of the second mask, resulting in each of the LED emitters with a second phosphor feature on the first phosphor feature.

In yet another example, the first openings have a first dimension; the second openings have a second dimension; and the second dimension is less than the first dimension.

In yet another example, the mask includes a mask substrate of a material selected from the group consisting of metal, quartz and ceramic; and the plurality of first openings are formed in the mask substrate.

The present disclosure also provides another embodiment of a method of making a light emitting diode (LED) apparatus. The method includes providing a plurality of LED emitters disposed on a substrate; providing a first mask over the plurality of LED emitters, wherein the first mask includes a plurality of first openings with a first dimension; coating the plurality of LED emitters using a first phosphor material through the first openings of the first mask; providing a second mask over the plurality of LED emitters, wherein the second mask includes a plurality of second openings with a second dimension less than the first dimension; coating the plurality of LED emitters using a second phosphor material through the second openings of the second mask, resulting in each of the LED emitters having a phosphor film and a second phosphor film on the first phosphor film.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A light emitting diode (LED) apparatus, comprising:
an LED emitter having a top surface; and
a phosphor feature disposed on the LED emitter, wherein the phosphor feature includes
a first phosphor film disposed on the top surface of the LED emitter and having a first dimension defined in a direction parallel to the top surface of the LED emitter, wherein the first phosphor film has a first curved surface profile;
a second phosphor film disposed on the first phosphor film and having a second dimension defined in the direction, wherein the second phosphor film has a second curved surface profile, and wherein the second dimension is substantially less than the first dimension, and wherein the first phosphor film and the second phosphor film each have non-uniform thicknesses.

2. The LED apparatus of claim 1, wherein
the first phosphor film includes a first phosphor material; and
the second phosphor film includes a second phosphor material different from the first phosphor material.

3. The LED apparatus of claim 2, wherein
the first phosphor material emits a first light having a first peak wavelength; and
the second phosphor material emits a second light having a second peak wavelength that is substantially greater than the first peak wavelength.

4. The LED apparatus of claim 3, wherein
the LED emitter emits a blue light;
the first phosphor material emits a yellow light upon being excited by the blue light from the LED emitter; and
the second phosphor material emits a red light upon being excited by the blue light from the LED emitter.

5. The LED apparatus of claim 1, wherein
the LED emitter includes a first region and a second region surrounding the first region on the top surface;
the first phosphor film is disposed in both the first region and the second region; and
the second phosphor film is disposed within the first region.

6. The LED apparatus of claim 5, wherein the first phosphor film and the second phosphor film include a same phosphor material.

7. The LED apparatus of claim 5, wherein
the first phosphor film has a first maximum thickness and the second phosphor film has a second maximum thickness; and
the phosphor feature has a third maximum thickness in the first region and a fourth maximum thickness in the second region, wherein
the third maximum thickness is equal to the sum of the first maximum thickness and the second maximum thickness; and
the fourth maximum thickness is equal to the first maximum thickness.

8. The LED apparatus of claim 1, wherein at least one of the first and second phosphor films is patterned to have a plurality of sub-features configured in an array.

9. The LED apparatus of claim 8, wherein the plurality of sub-features each include a shape selected from the group consisting of a disk, a square, and a polygon, in a top view.

10. The LED apparatus of claim 8, wherein
the plurality of sub-features includes a plurality peak points and a plurality of dip points; and
the peak points are interdigitated with the dip points in the direction.

11. The LED apparatus of claim 10, wherein the peak points and the dip points are configured periodically along the direction.

12. The LED apparatus of claim 1, wherein the first curved surface profile is different from the second curved surface profile.

13. The LED apparatus of claim 1, wherein the phosphor feature is disposed on the top surface of the LED emitter but not on side surfaces of the LED emitter.

14. A light emitting diode (LED) apparatus, comprising:
an LED emitter; and
a first phosphor layer disposed on the LED emitter and patterned to have a plurality of sub-features in an array, wherein each of the sub-features has a curved surface profile, and wherein bottom surfaces of the sub-features are in direct contact with an upper surface of the LED emitter.

15. The LED apparatus of claim 14, wherein the plurality of sub-features each include one shape selected from the group consisting of a disk, a square, and a polygon, in a top view.

16. The LED apparatus of claim 14, wherein the first phosphor layer has a periodic surface profile that includes a plurality of peak points and a plurality of dip points, the dip points being substantially below the peak points in a sectional view.

17. The LED apparatus of claim 14, further comprising a second phosphor layer disposed on the first phosphor layer.

18. The LED apparatus of claim 17, wherein
the first phosphor layer spans to a first dimension in a first direction parallel with a top surface of the LED emitter;
the second phosphor layer spans to a second dimension in the first direction; and
the first dimension is substantially greater than the second dimension.

19. The LED apparatus of claim 14, wherein the first phosphor layer includes
an encapsulation material containing one of silicone and epoxy; and
a phosphor power dispersed in the encapsulation material.

20. A light emitting diode (LED) apparatus, comprising:
an LED emitter having a top surface and side surfaces;
a first phosphor layer located on the top surface of the LED emitter, the first phosphor layer containing a first phosphor material and having a first curved surface profile, wherein the first phosphor layer has a non-uniform thickness; and
a second phosphor layer located on the first phosphor layer, the second phosphor layer containing a second phosphor material different from the first phosphor material and having a second curved surface profile different from the first curved surface profile, wherein the second phosphor layer has a non-uniform thickness, wherein the second phosphor layer has a smaller lateral dimension than the first phosphor layer, and wherein the second phosphor layer is being circumferentially surrounded by the first phosphor layer in a top view.

21. The LED apparatus of claim 20, wherein:
the first phosphor material is a yellow phosphor; and
the second phosphor material is a red phosphor.

22. The LED apparatus of claim 20, wherein the first and second phosphor layers are free of being located on the side surfaces of the LED emitter.

* * * * *